US012517427B2

(12) United States Patent
Liu et al.

(10) Patent No.: US 12,517,427 B2
(45) Date of Patent: Jan. 6, 2026

(54) PHOTORESIST, METHOD OF MANUFACTURING A SEMICONDUCTOR DEVICE AND METHOD OF EXTREME ULTRAVIOLET LITHOGRAPHY

(71) Applicants: TAIWAN SEMICONDUCTOR MANUFACTURING COMPANY, LTD., Hsinchu (TW); NATIONAL TSING HUA UNIVERSITY, Hsinchu (TW)

(72) Inventors: Jui-Hsiung Liu, Taipei (TW); Po-Hsuan Lee, Tainan (TW); An-Yun Lu, Taoyuan (TW); Kuang-Ting Chen, Taipei (TW); Po-Hsiung Chen, Taichung (TW); Burn Jeng Lin, Hsinchu (TW)

(73) Assignees: TAIWAN SEMICONDUCTOR MANUFACTURING COMPANY, LTD., Hsinchu (TW); NATIONAL TSING HUA UNIVERSITY, Hsinchu (TW)

( * ) Notice: Subject to any disclaimer, the term of this patent is extended or adjusted under 35 U.S.C. 154(b) by 895 days.

(21) Appl. No.: 17/669,987

(22) Filed: Feb. 11, 2022

(65) Prior Publication Data
US 2023/0259024 A1    Aug. 17, 2023

(51) Int. Cl.
G03F 7/004    (2006.01)
G03F 7/00    (2006.01)
G03F 7/20    (2006.01)
H01L 21/027    (2006.01)

(52) U.S. Cl.
CPC .......... G03F 7/0042 (2013.01); G03F 7/2004 (2013.01); G03F 7/70033 (2013.01); G03F 7/702 (2013.01); H01L 21/0274 (2013.01)

(58) Field of Classification Search
CPC ..... G03F 7/0042; G03F 7/0043; G03F 7/0044
See application file for complete search history.

(56) References Cited

U.S. PATENT DOCUMENTS

| | | |
|---|---|---|
| 8,764,995 B2 | 7/2014 | Chang |
| 8,796,666 B1 | 8/2014 | Huang |
| 8,828,625 B2 | 9/2014 | Lu |
| 8,841,047 B2 | 9/2014 | Yu |
| 8,877,409 B2 | 11/2014 | Hsu |
| 9,012,132 B2 | 4/2015 | Chang |
| 9,028,915 B2 | 5/2015 | Chang et al. |
| 9,093,530 B2 | 7/2015 | Huang |
| 9,146,469 B2 | 9/2015 | Liu |
| 9,184,054 B1 | 11/2015 | Huang |
| 9,213,234 B2 | 12/2015 | Chang |
| 9,223,220 B2 | 12/2015 | Chang |
| 9,256,123 B2 | 2/2016 | Shih |
| 9,256,133 B2 | 2/2016 | Chang |
| 9,529,268 B2 | 12/2016 | Chang |
| 9,536,759 B2 | 1/2017 | Yang |
| 9,548,303 B2 | 1/2017 | Lee |
| 2019/0153001 A1 | 5/2019 | Cardineau |
| 2020/0117085 A1 | 4/2020 | Moon |
| 2020/0133127 A1* | 4/2020 | Shih .................... G03F 7/70575 |
| 2021/0087210 A1 | 3/2021 | Chang et al. |
| 2022/0244645 A1* | 8/2022 | Tan .................... H01L 21/67259 |
| 2022/0365428 A1* | 11/2022 | Weng .................. H01L 21/0276 |

FOREIGN PATENT DOCUMENTS

TW    202112791 A    4/2021

OTHER PUBLICATIONS

Meredith C. Sharps et al., "Organotin Carboxylate Reagents for Nanopatterning: Chemical Transformations during Direct-Write Electron Beam Processes." Chemistry of Materials, vol. 31, 2019, pp. 4840-4850.

Meredith C. Sharps et al., "Implications of Crystal Structure on Organotin Carboxylate Photoresists." Crystal Research and Technology, vol. 52, Issue 10, 2017, pp. 1700081-1-1700081-7.

Vadapalli Chandrasekhar et al., "Nanodimensional Organostannoxane Molecular Assemblies." Accounts of Chemical Research, vol. 40, Issue 6, 2007, pp. 420-434.

Brian Cardineau et al., "EUV Resists Based on Tin-Oxo Clusters." SPIE Proceedings Advances in Patterning Materials and Processes XXXI, Proc. of SPIE vol. 9051 2014.

Ryan Del Re et al., "Low-LER Tin Carboxylate Photoresists Using EUV." Spie Proceedings Extreme Ultraviolet (EUV) Lithography VI, Proc. of SPIE vol. 9422, 2015.

* cited by examiner

Primary Examiner — Daborah Chacko-Davis
(74) Attorney, Agent, or Firm — Maschoff Brennan

(57) ABSTRACT

A method of manufacturing a semiconductor device includes forming a photoresist layer over a substrate, selectively exposing the photoresist layer to an EUV radiation, and developing the selectively exposed photoresist layer. The photoresist layer has a composition including a solvent and a photo-active compound dissolved in the solvent and composed of a molecular cluster compound incorporating hexameric tin and two chloro ligands.

20 Claims, 11 Drawing Sheets

PHOTORESIST, METHOD OF MANUFACTURING A SEMICONDUCTOR DEVICE AND METHOD OF EXTREME ULTRAVIOLET LITHOGRAPHY

BACKGROUND

As modern integrated circuits shrink in size, the associated features shrink in size as well. Lithography is a mechanism by which a pattern on a mask is projected onto a substrate such as a semiconductor wafer. In areas such as semiconductor photolithography, it has become necessary to create images on the semiconductor wafer which incorporate minimum feature sizes under a resolution limit or critical dimension (CD). Semiconductor photolithography typically includes the steps of applying a coating of photoresist (also referred to as resist) on a top surface (e.g., a thin film stack) of a semiconductor wafer and exposing the photoresist to a pattern. The semiconductor wafer is then transferred to a developing chamber to remove the exposed resist, which is soluble to an aqueous developer solution. As a result, a patterned layer of photoresist exists on the top surface of the wafer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
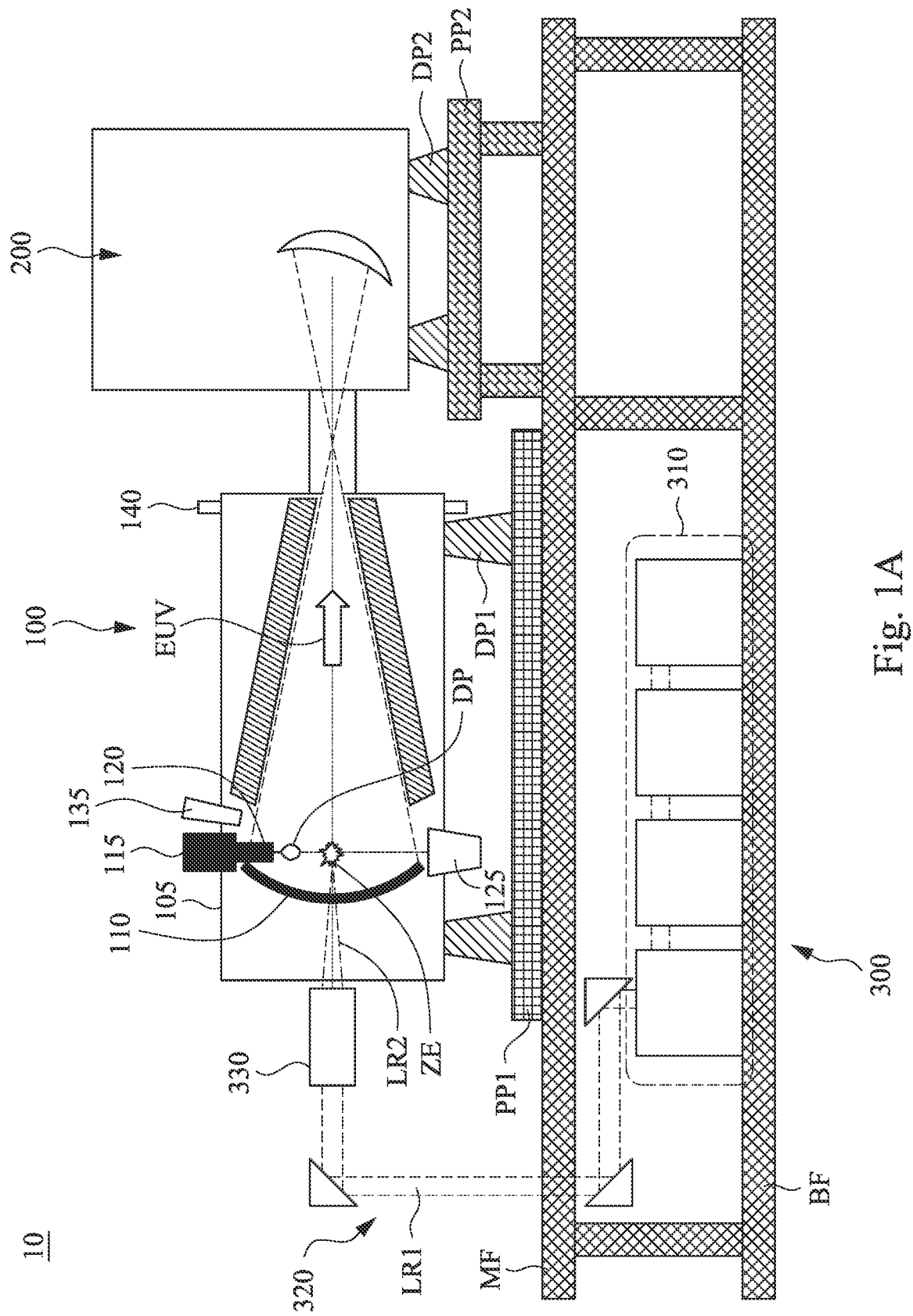
FIG. 1A is a schematic view of an EUV lithography tool with an LPP-based EUV radiation source, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic view diagram of a EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 100 to generate EUV light, such as EUV light having a wavelength ranging between about 1 nm and about 100 nm. In one particular example, the radiation source 100 generates a EUV light with a wavelength centered at about 13.5 nm. Accordingly, the radiation source 100 is also referred to as EUV radiation source 100.

Extreme ultraviolet (EUV) lithography has become widely used due to its ability to achieve small semiconductor device sizes, for example for 20 nanometer (nm) technology nodes. Metal oxide based photoresists, such as tin based coating materials, exhibit good absorption of far ultraviolet light at a 193 nm wavelength and extreme ultraviolet light at a 13.5 nm wavelength, being more efficient than organic polymers in EUV absorptions. Although metal oxide photoresists have nice lithographic patterns, they are sensitive to air and moisture and tend to from microcrystalline particles, leading to increased surface defects, adversely affecting the quality of the overall coating.

The present disclosure provides a novel photoresist having hexameric tin clusters with two chloro ligands. These two chloro ligands can break the molecular symmetry of the photoresist, avoiding the formation of microcrystalline particles. In particular, chloro atoms can absorb EUV light, enhancing the photosensitivity of the photoresist. Consequently, the photoresist can be formed into a thin and smooth film over a large area with reduced surface defects. The various aspects of the present disclosure will be discussed below in greater detail with reference to FIGS. 1A-10. First, a EUV lithography system will be discussed below with reference to FIGS. 1A, 1B and 2. Next, the details of the novel photoresist and the lithography process employing the photoresist will be discussed with reference to FIGS. 3-10.

The advanced lithography process, method, and materials described in the current disclosure can be used in many applications, including fin-type field effect transistors (Fin-FETs), gate-all-around (GAA) FETs. For example, the fins may be patterned to produce a relatively close spacing between features, for which the above disclosure is well suited. In addition, spacers used in forming fins of FinFETs can be processed according to the above disclosure.

To address the trend of the Moore's law for decreasing size of chip components and the demand of higher computing power chips for mobile electronic devices such as smart phones with computer functions, multi-tasking capabilities, or even with workstation power. Smaller wavelength photolithography exposure systems are desirable. Extreme ultraviolet (EUV) photolithography technique uses an EUV radiation source to emit an EUV light ray with wavelength of about 13.5 nm. Because this wavelength is also in the x-ray radiation wavelength region, the EUV radiation source is also called a soft x-ray radiation source. The EUV light rays emitted from a laser-produced plasma (LPP) are collected by a collector mirror and reflected toward a patterned mask.

FIG. 1A is a schematic view of an EUV lithography tool with an LPP-based EUV radiation source, in accordance with some embodiments of the present disclosure. The EUV lithography system includes an EUV radiation source 100 to generate EUV radiation, an exposure device 200, such as a scanner, and an excitation laser source 300. As shown in FIG. 1A, in some embodiments, the EUV radiation source 100 and the exposure device 200 are installed on a main floor MF of a clean room, while the excitation laser source 300 is installed in a base floor BF located under the main floor MF. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer to EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 1B:
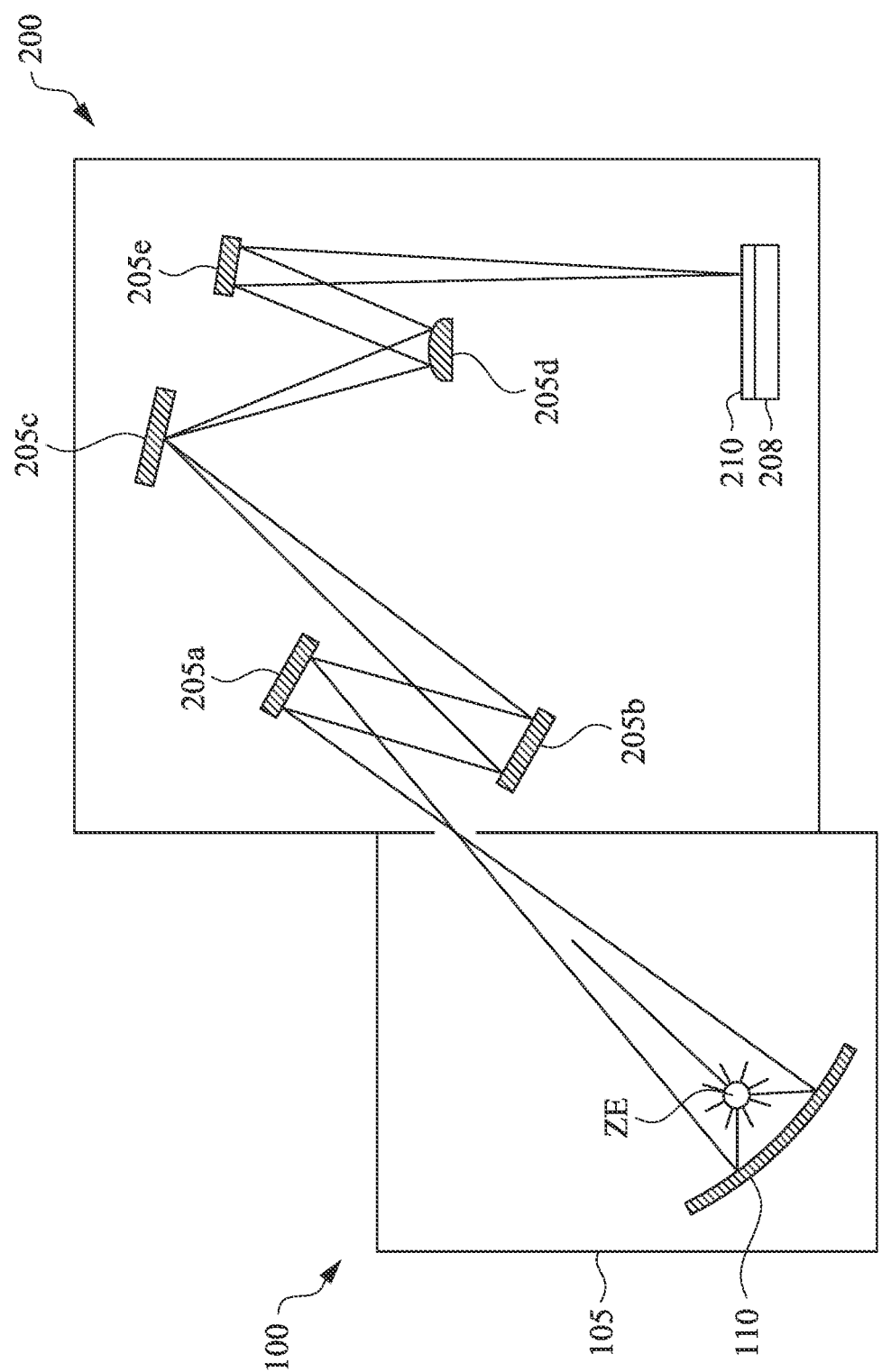
FIG. 1B is a simplified schematic diagram of a detail of an extreme ultraviolet lithography tool according to an embodiment of the disclosure showing the exposure of photoresist coated substrate with a patterned beam of EUV light.

FIG. 1B is a simplified schematic diagram of a detail of an extreme ultraviolet lithography tool according to an embodiment of the disclosure showing the exposure of photoresist coated substrate 210 secured on a substrate stage 208 of the exposure device 200 with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a reticle, with a beam of EUV light, to produce a patterned beam, and one or more reduction projection optics 205d, 205e, for projecting the patterned beam onto the photoresist coated substrate 210. A mechanical assembly (not shown) may be provided for generating a controlled relative movement between the photoresist coated substrate 210 and the patterning optic 205c. As further shown in FIG. 2, the EUVL tool includes an EUV radiation source 100 including an EUV light radiator ZE emitting EUV light in a chamber 105 that is reflected by a collector 110 along a path into the exposure device 200 to irradiate the photoresist coated substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is directed to, but not limited to, components which operate solely or to advantage within one or more specific wavelength range(s) such as at the EUV output light wavelength, the irradiation laser wavelength, a wavelength suitable for metrology or any other specific wavelength.

In various embodiments of the present disclosure, the photoresist coated substrate 210 is a semiconductor wafer, such as a silicon wafer or other type of wafer to be patterned.

The EUVL tool further includes other modules or is integrated with (or coupled with) other modules in some embodiments.

As shown in FIG. 1A, the EUV radiation source 100 includes a target droplet generator 115 and a collector 110, enclosed by a chamber 105. For example, the collector 110 is a laser-produced plasma (LPP) collector. In various embodiments, the target droplet generator 115 includes a reservoir to hold a source material and a nozzle 120 through which target droplets DP of the source material are supplied into the chamber 105.

In some embodiments, the target droplets DP are metal droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz).

Referring back to FIG. 1A, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser generator 310 has a wavelength of about 9.4 µm or about 10.6 µm, in an embodiment. The laser light LR1 generated by the laser generator 310 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 µm or less, and the main laser pulses have a spot size in a range of about 150 µm to about 300 µm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with (e.g., synchronized with) the ejection-frequency of the target droplets DP in an embodiment.

The excitation laser LR2 is directed through windows (or lenses) into the zone of excitation ZE in front of the collector 110. The windows are made of a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector 110. The collector 110 further reflects and focuses the EUV radiation for the lithography exposing processes performed through the exposure device 200. The droplet catcher 125 is used for catching excessive target droplets. For example, some target droplets may be purposely missed by the laser pulses.

In some embodiments, the collector 110 is designed with a proper coating material and shape to function as a mirror for EUV collection, reflection, and focusing. In some embodiments, the collector 110 is designed to have an ellipsoidal geometry. In some embodiments, the coating material of the collector 110 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In the present disclosure, the terms mask, photomask, and reticle are used interchangeably. In the present embodiment, the patterning optic 205c is a reflective mask 205c. The reflective mask 205c also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 205c may further include a capping layer, such as ruthenium (Ru), disposed on the ML for protection. The mask 205c further includes an absorption layer deposited over the ML. The absorption layer is patterned to define a layer of an integrated circuit (IC), the absorber layer is discussed below in greater detail according to various aspects of the present disclosure. Alternatively, another reflective layer may be deposited over the ML and is patterned to define a layer of an integrated circuit, thereby forming a EUV phase shift mask.

The mask 205c and the method making the same are further described in accordance with some embodiments. In some embodiments, the mask fabrication process includes two operations: a blank mask fabrication process and a mask patterning process. During the blank mask fabrication process, a blank mask is formed by depositing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

Figure 2:
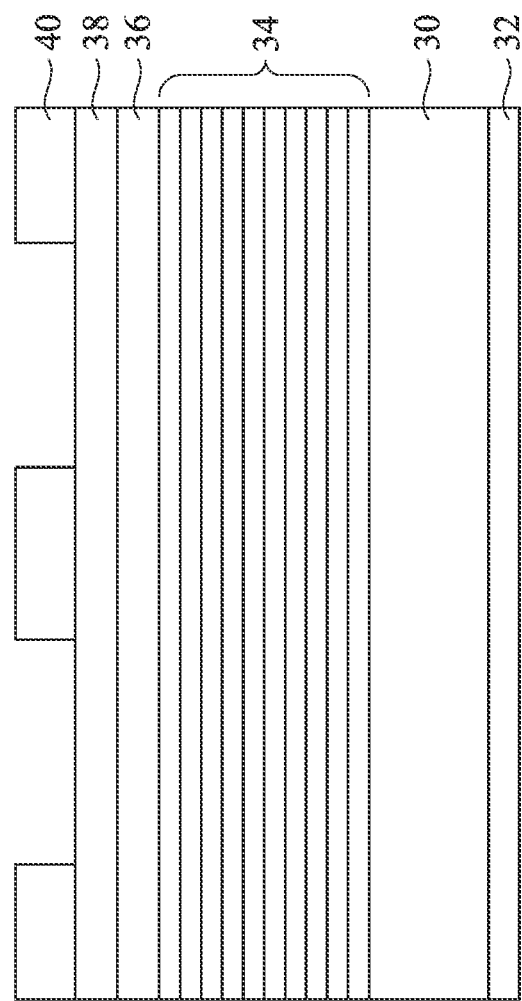
FIG. 2 is a sectional view of a EUV mask constructed in accordance with some embodiments of the present disclosure.

One example of the reflective mask 205c is shown in FIG. 2. The reflective mask 205c in the illustrated embodiment is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN), though other suitable compositions are possible.

The reflective mask 205c includes a reflective multilayer (ML) structure 34 disposed over the LTEM substrate 30. The ML structure 34 may be selected such that it provides a high reflectivity to a selected radiation type/wavelength. The ML structure 34 includes a plurality of film pairs, such as Mo/Si film pairs (e.g., a layer of molybdenum above or below a layer of silicon in each film pair). Alternatively, the ML structure 34 may include Mo/Be film pairs, or any materials with refractive index difference being highly reflective at EUV wavelengths.

Still referring to FIG. 2, the EUV mask 205c also includes a capping layer 36 disposed over the ML structure 34 to prevent oxidation of the ML. The EUV mask 205c may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 205c also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

FIGS. 3, 4, 5 and 10 are diagrammatic fragmentary cross-sectional side views of a semiconductor device 45 at various stages of fabrication in accordance with various aspects of the present disclosure. The semiconductor device 45 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Figure 3:
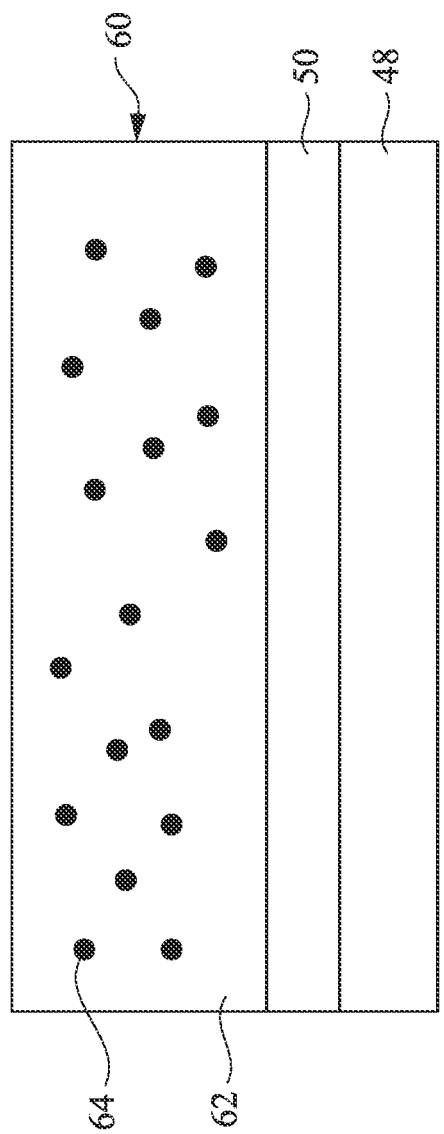
FIGS. 3, 4 and 5 are diagrammatic fragmentary cross-sectional side views of a semiconductor device at various stages of fabrication in accordance with various aspects of the present disclosure.

Referring to FIG. 3, a semiconductor device 45 includes a substrate 48. In some embodiments, the substrate 48 is a silicon substrate doped with a p-type dopant such as boron (for example a p-type substrate). Alternatively, the substrate 48 could be another suitable semiconductor material. For example, the substrate 48 may be a silicon substrate that is doped with an n-type dopant such as phosphorous or arsenic (an n-type substrate). The substrate 48 could include other elementary semiconductors such as germanium and diamond. The substrate 48 could optionally include a compound semiconductor and/or an alloy semiconductor. Further, the substrate 48 could include an epitaxial layer (epi layer), may be strained for performance enhancement, and may include a silicon-on-insulator (SOI) structure.

In some embodiments, the substrate 48 is substantially conductive or semi-conductive. The electrical resistance may be less than about 103 ohm-meter. In some embodiments, the substrate 48 contains metal, metal alloy, or metal nitride/sulfide/selenide/oxide/silicide with the formula $MX_a$, where M is a metal, and X is N, S, Se, O, Si, and where "a" is in a range from about 0.4 to 2.5. For example, the substrate 48 may contain Ti, Al, Co, Ru, TiN, $WN_2$, or TaN.

In some other embodiments, the substrate 48 contains a dielectric material with a dielectric constant in a range from about 1 to about 40. In some other embodiments, the substrate 48 contains Si, metal oxide, or metal nitride, where the formula is $MX_b$, wherein M is a metal or Si, and X is N or O, and wherein "b" is in a range from about 0.4 to 2.5. For example, the substrate 48 may contain $SiO_2$, silicon nitride, aluminum oxide, hafnium oxide, or lanthanum oxide.

A material layer 50 is formed over the substrate 48. The material layer 50 can be patterned via a lithography process and as such may also be referred to as a patternable layer. In an embodiment, the material layer 50 includes a dielectric material, such as silicon oxide or silicon nitride. In another embodiment, the material layer 50 includes metal. In yet another embodiment, the material layer 50 includes a semiconductor material.

In some embodiments, the material layer 50 has different optical properties than photoresist. For example, the material layer 50 has a different n, k, or T value from photoresist. In some embodiments, the material layer 50 and the overlying photoresist layer have different etching resistance. In some embodiments, the material layer 50 contains an etching resistant molecule. It is understood that the substrate 48 and the material layer 50 may each include additional suitable material compositions in other embodiments.

A photoresist layer 60 is formed over the material layer 50. The photoresist layer 60 may be formed by a spin-coating process. For example, the photoresist layer 60 can be spin coated on a 4-inch silicon wafer. A few ml of composition of the photoresist layer 60 is placed (dispensed) on the silicon wafer which is brought to a rotational speed of several 1000±10 rpm (e.g., 1500 rpm) for 10 to 20 seconds, for example, 10 seconds, followed by 2000±10 rpm for 25 to 35 seconds, for example, 25 seconds. The photoresist layer 60 is then baked at 60° C. to 100° C. for 60 to 70 seconds, for example, 60 seconds. In some embodiments, the photoresist layer 60 has a thickness in a range from 20 nm to 25 nm.

The photoresist layer 60 includes a solvent 62 and a photo-active component 64 dissolved in the solvent 62. The solvent 62 includes an appropriate organic solvent for the adjustment of its viscosity. Such organic solvents include, but are not limited to, 4-methyl-2-pentanol. The content of the photo-active compound 64 is 1.2 wt % to 1.5 wt % in 4-methyl-2-pentanol with respect to the photoresist layer 60.

The photo-active component 64 may be a metal oxide-containing compound. For example, the photo-active component 64 is a tin oxide-containing compound and has the following general formula (I):

$$(RSn)_6O_4(R'CO_2)_4(R''CO_2)_4X_2 \qquad (I).$$

Herein, X in the above formula (I) is an anion having a halogen anion, for example, fluorine (F) anion, chlorine (Cl) anion, bromine (Br) anion or iodine (I) anion. Each of R, R' and R'' is one of the alkyl groups shown below:

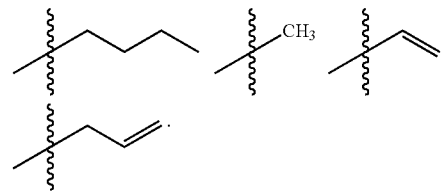

In some embodiments, the photo-active component 64 has the formula (I) as follows: $(RSn)_6O_4(R'CO_2)_4(R''CO_2)_4Cl_2$, and can be the following structure:

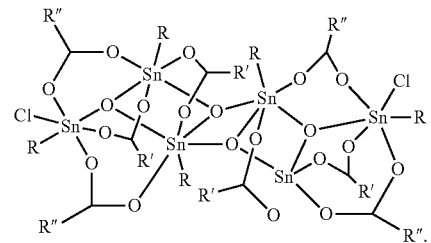

The photo-active component 64 has two chloro ligands. The chloro ligands can break the molecular symmetry, avoiding the formation of microcrystalline particles. In particular, chloro atoms can absorb EUV light, enhancing the photosensitivity of the photoresist layer 60. The photoactive component 64 has at least one ladder type structure. For example, the photo-active component 64 includes 6-tin ladder-type clusters. By introducing such ladder type structure into the photo-active compound 64, the photoresist layer 60 can be formed into a thin and smooth film over a large area. In some embodiments where the material layer 50 is a dielectric layer (e.g., a silicon oxide layer), the photoresist layer 60 can bond strongly to the material layer 50.

Figure 11:
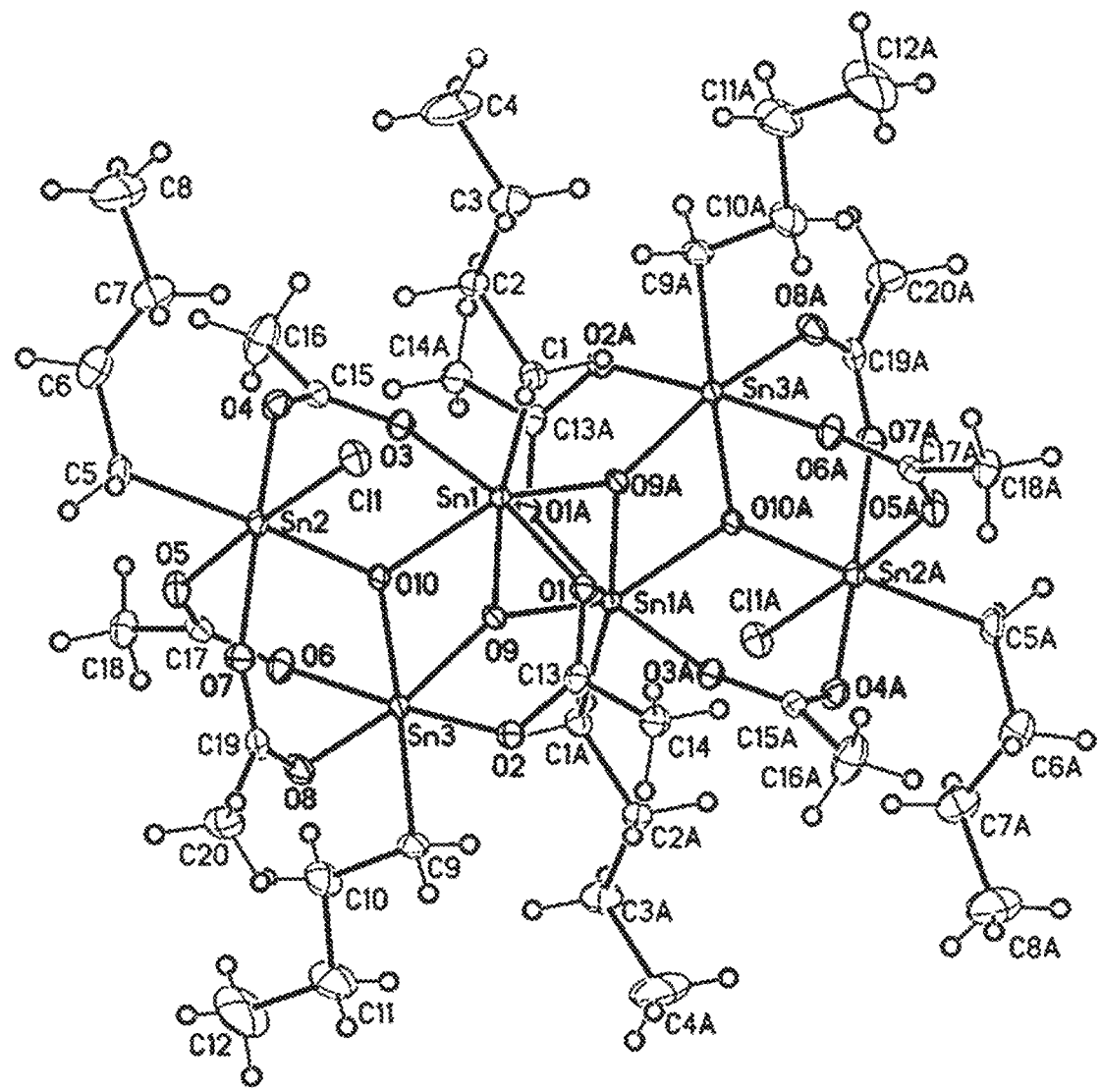
FIG. 11 is molecular structure of (n-BuSn)$_6$O$_4$(CH$_3$CO$_2$)$_8$Cl$_2$ determined by single-crystal X-ray diffraction studies.

In one example, the formula (I) can be $(n\text{-BuSn})_6O_4(CH_3CO_2)_8Cl_2$. The term "Bu" refers to butyl. The molecular structure of $(n\text{-BuSn})_6O_4(CH_3CO_2)_8Cl_2$ determined by single-crystal X-ray diffraction studies is shown in FIG. 11.

Figure 12:
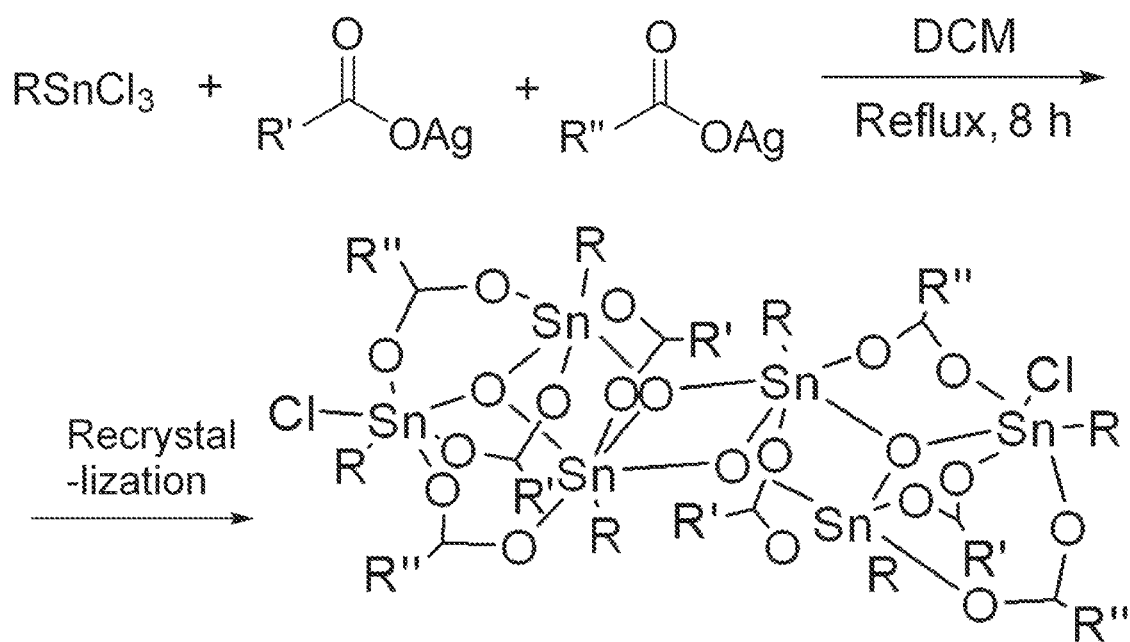
FIG. 12 is general reaction scheme 1 where the photoactive compound is synthesized by reacting RSnCl$_3$ with a compound and a compound.

In some embodiments, the photo-active compound 64 is synthesized by reacting $RSnCl_3$ with a compound MC-1 and a compound MC-2 as shown in the general reaction scheme 1 in FIG. 12.

The compound MC-1 and the compound MC-2 are silver carboxylate salts. In some embodiments, in the scheme 1, R' of the compound MC-1 and R" of the compound MC-2 are the same and represented by one of compounds shown below:

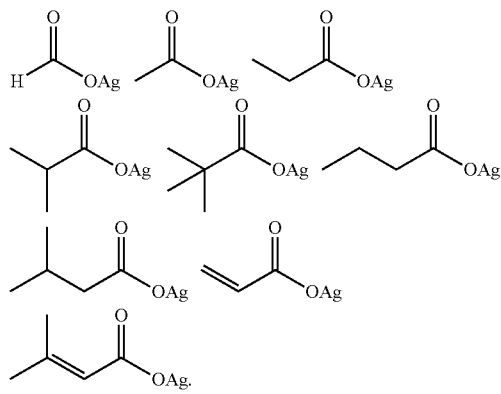

In some embodiments, R' of the compound MC-1 and R" of the compound MC-2 are the same. In other words, the compound MC-1 and the compound MC-2 have the same formula. In such condition, the amount of $RSnCl_3$ is 1 mol with respect to 2.5 mol of a sum of the compound MC-1 and the compound MC-2 in scheme 1.

In some embodiments, in scheme 1, R' of the compound MC-1 and R" of the compound MC-2 are different from each other and represented by compounds shown below:

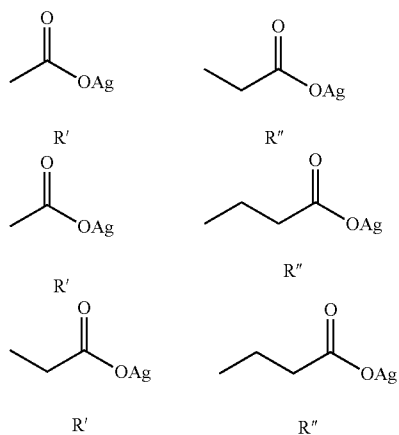

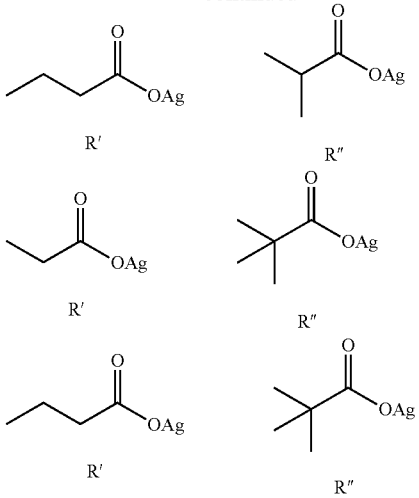

As shown above, R' of the compound MC-1 has a size different from a size of R" of the compound MC-2. For example, the size of R' of the compound MC-1 is smaller than the size of R" of the compound MC-2. In some embodiments where R' of the compound MC-1 and R" of the compound MC-2 are different in size, the amount of $RSnCl_3$ is 1 mol with respect to 1 mol of the compound MC-1 and 1 mol of the compound MC-2 in scheme 1.

In scheme 1, $RSnCl_3$, the compound MC-1 and the compound MC-2 were added in a dichloromethane (DCM), and the mixture thereof was stirred for 8 to 9 hours, for example, 8 hours, under reflux. The crude product was purified by recrystallization, thereby obtaining the photo-active compound 64 as a solid.

Figure 4:
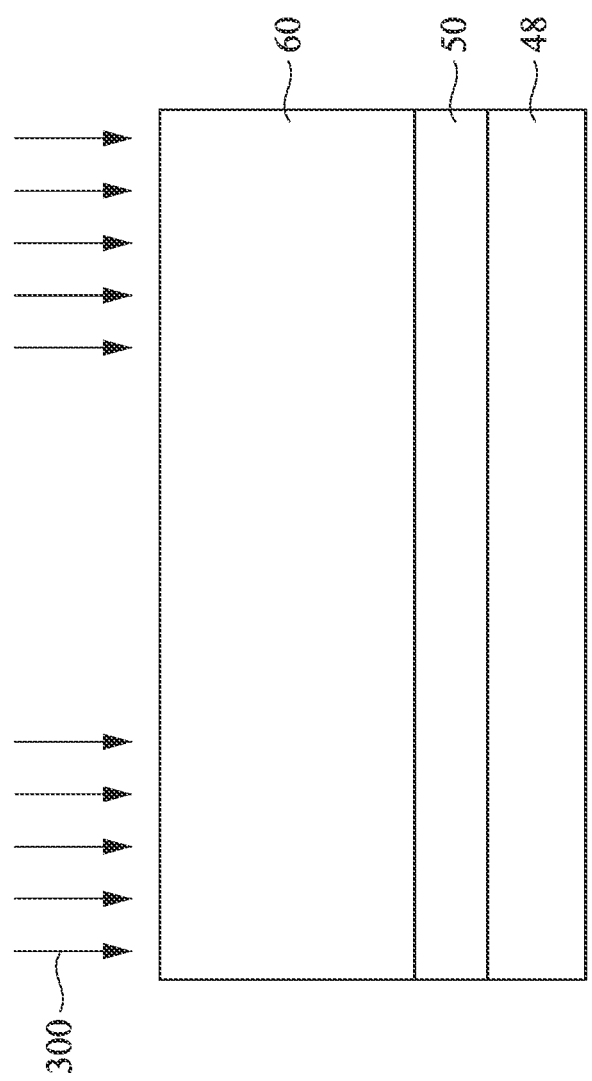

Referring now to FIG. 4, an exposure process 300 is performed to selectively expose the photoresist layer 60 to an EUV radiation. The exposure process 300 applies the EUV radiation to an area of the photoresist layer 60. In some embodiments, the photoresist layer can be patterned using low dose EUV, for example, in a range from 100 mJ/cm$^2$ to 200 mJ/cm$^2$, for example, 100 mJ/cm$^2$. After the photoresist layer 60 is exposed, the photoresist layer 60 is baked at 80° C. to 100° C. for 1 minute to 2 minute, for example, 1 minute.

Figure 5:
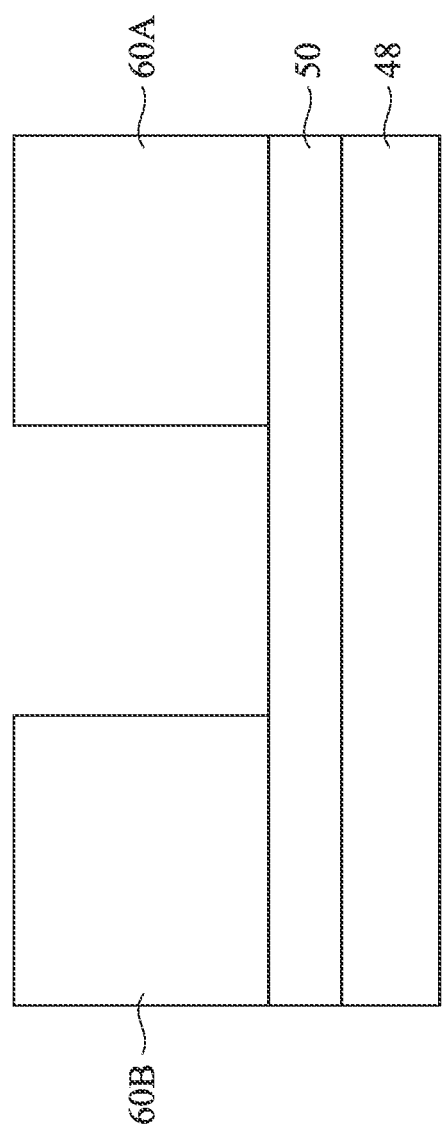

Referring now to FIG. 5, the selectively exposed photoresist layer 60 is developed. For example, subsequent lithography processes (e.g., post-exposure baking, developing, rinsing, etc.) may be performed to form a patterned photoresist, which for the sake of simplicity is illustrated herein as photoresist segments 60A and 60B separated by a recess. The selectively exposed photoresist layer 60 is developed using acetone for 60 seconds followed by being baked at 80° C. to 100° C.

Figure 7:
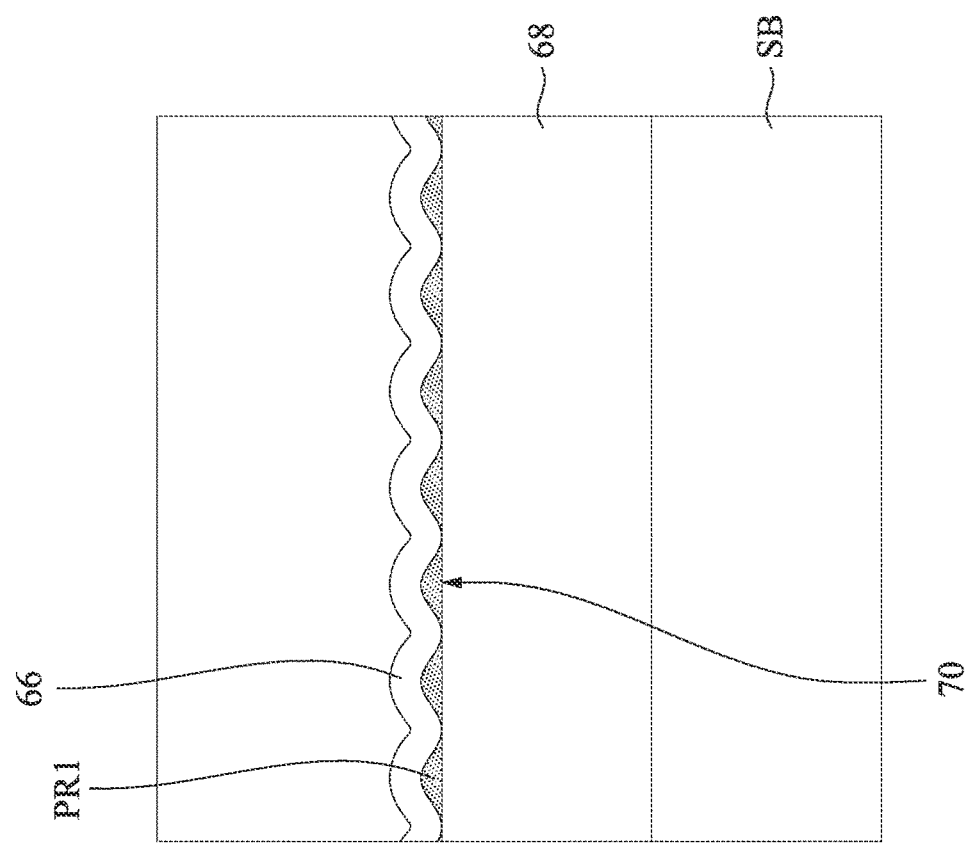
FIG. 7 is a cross-sectional view along line A'-A of FIG. 6.
Figure 6:
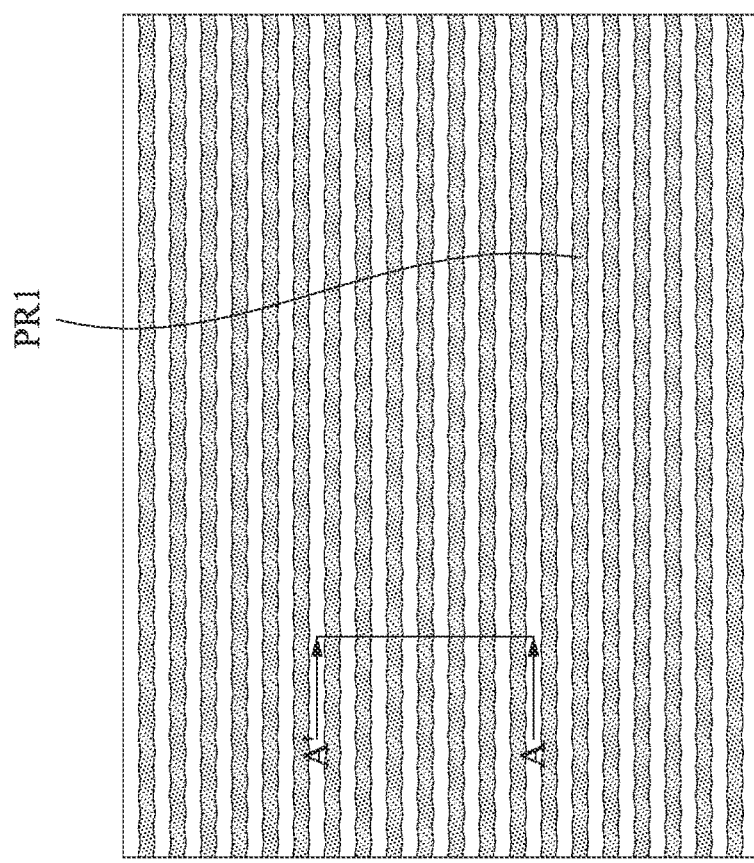
FIG. 6 illustrates a top view of photoresist segments with a half-pinch (HP) of 22 nm that may be observed using a scanning electron microscope (SEM) in accordance with some embodiments.

The photoresist segments 60A and 60B show no defects over a large domain (e.g., 1.0±0.1 mm×0.7±0.1 mm). This feature is also supported by 12 SEM images and three of them are shown as follows. FIG. 6 illustrates a top view of photoresist segments PR1 with a half-pinch (HP) of 22±0.1 nm that may be observed using a scanning electron microscope (SEM) in accordance with some embodiments. FIG. 7 is a cross-sectional view along line A'-A of FIG. 6. Reference is made to FIGS. 6-7. These photoresist segments PR1 are derived from a photoresist layer, spin coated on a dielectric layer 68 over a substrate SB and exposed using EUV with dose of 200±10 mJ/cm$^2$ and are coated with platinum (Pt) 66 for SEM measurement. The photoresist segments PR1 have a thickness in a range from 6 nm to 8 nm, for example, 7 nm. No defect is observable in FIGS. 6-7. The photoresist segments PR1 have high quality and show no defects over a large domain. For example, the photoresist segments PR1 remain intact and have a reduced Line-Edge Roughness (LER) and a reduced Line-Width Roughness (LWR).

Figure 8:
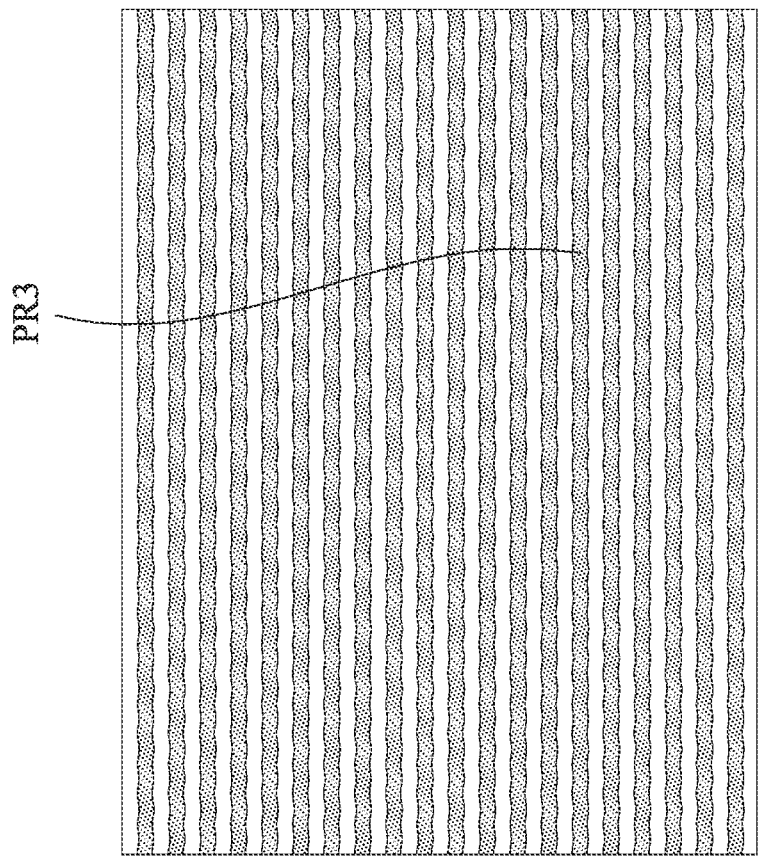
FIGS. 8-9 illustrate top views of a photoresist layer after exposure by EUV radiation with dose of 200±10 mJ/cm$^2$, forming photoresist segments with a half-pinch (HP) of 16 nm and 18 nm, respectively, that may be observed using a scanning electron microscope (SEM) in accordance with some embodiments.
Figure 9:
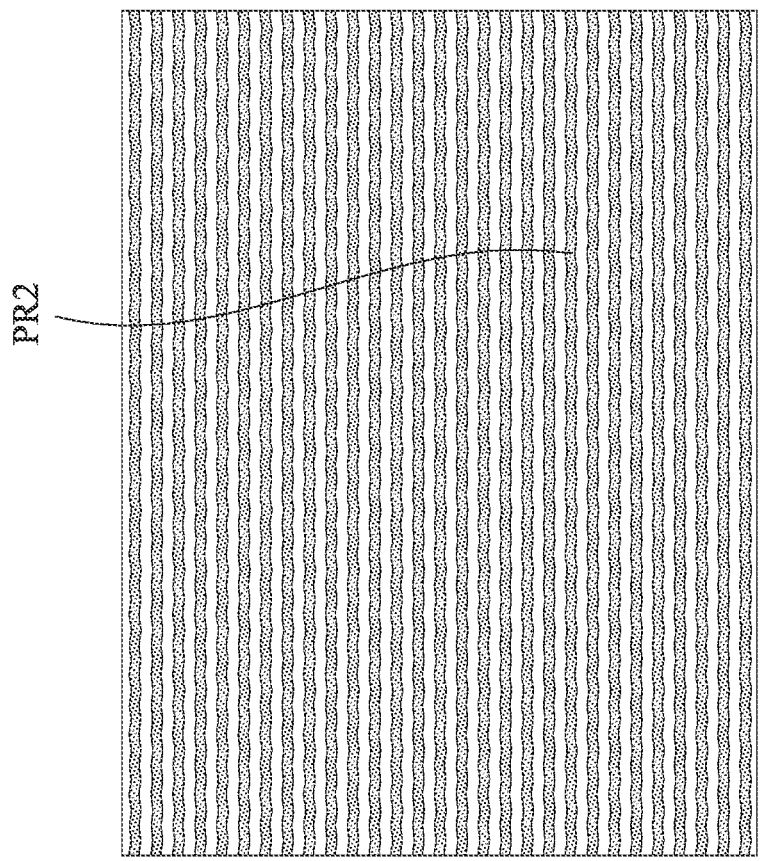
Figure 10:
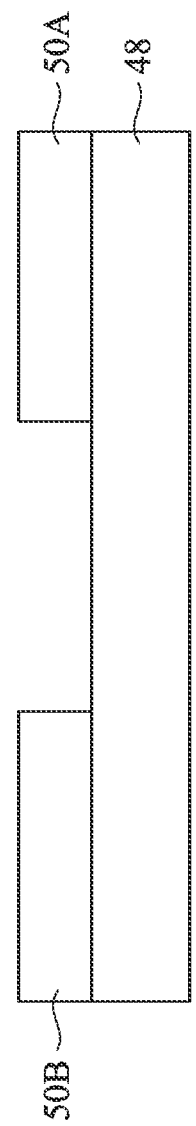
FIG. 10 is a diagrammatic fragmentary cross-sectional side view of a semiconductor device at various stages of fabrication in accordance with various aspects of the present disclosure.

FIGS. 8-9 illustrate top views of a photoresist layer after exposure by EUV radiation with dose of 200±10 mJ/cm$^2$, forming photoresist segments PR2 and PR3 with a half-pinch (HP) of 16±0.1 nm and 18±0.1 nm, respectively, that may be observed using a scanning electron microscope (SEM) in accordance with some embodiments. Reference is made to FIGS. 8-9. The photoresist segments PR2 and PR3 have high quality and show no defects over a large domain. For example, the photoresist segments PR2 and PR3 remain intact and have a reduced Line-Edge Roughness (LER) and a reduced Line-Width Roughness (LWR).

Using the patterned photoresist as a mask, additional fabrication processes such as etching or implantation may be performed. For example, referring to FIG. 10, the material layer 50 is etched into segments 50A and 50B separated by a recess. Thereafter, the patterned photoresist may be removed by a photoresist removal process known in the art, such as a stripping or an ashing process.

Although the discussions above use EUV lithography as an example, it is understood that the various aspects of the photoresist layer may apply to other types of lithography as well, such as an e-beam lithography.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that the photo-active component has two chloro ligands. The chloro ligands can break the molecular symmetry, avoiding the formation of microcrystalline particles. Another advantage is that chloro atoms can absorb EUV light, enhancing the photosensitivity of the photoresist layer. Yet another advantage is that because the photo-active component includes 6-tin ladder-type clusters, the photoresist layer can be formed into a thin and smooth film over a large area. The presence of chloride can also enhance the photo-polymerization when the neighboring carboxylate is decomposed by EUV light. Chloride will become a bridging ligand between two tin metal. This new process will provide a film of SnO$_x$Cl$_y$, instead of SnO$_2$.

In some embodiments, a method of manufacturing a semiconductor device includes forming a photoresist layer over a substrate, selectively exposing the photoresist layer to an EUV radiation, and developing the selectively exposed photoresist layer. The photoresist layer has a composition including a solvent and a photo-active compound dissolved in the solvent and composed of a molecular cluster compound incorporating hexameric tin and two chloro ligands. In some embodiments, the molecular cluster compound is (RSn)$_6$O$_4$(R'CO$_2$)$_4$(R"CO$_2$)$_4$Cl$_2$. In some embodiments, the R' has a size smaller than a size of the R". In some embodiments, the R' and the R" has the same structural formula. In some embodiments, the molecular cluster compound is (n-BuSn)$_6$O$_4$(CH$_3$CO$_2$)$_8$Cl$_2$. In some embodiments, the EUV radiation has a dose in a range from 100 mJ/cm$^2$ to 200 mJ/cm$^2$. In some embodiments, a content of the photo-active compound is 1.2 wt % to 1.5 wt % in the solvent with respect to the photoresist layer.

In some embodiments, an extreme ultraviolet lithography (EUVL) method includes turning on a droplet generator to eject a metal droplet toward a zone of excitation in front of a collector, turning on a laser source to emit a laser toward the zone of excitation, such that the metal droplet is heated by the laser to generate EUV radiation, guiding the EUV radiation, by using one or more first optics, toward a reflective mask in an exposure device, and guiding the EUV radiation, by using one or more second optics, reflected from the reflective mask toward a photoresist coated substrate in the exposure device. The photoresist includes a solvent and a photo-active compound dissolved in the solvent and containing the following formula (I):

(RSn)$_6$O$_4$(R'CO$_2$)$_4$(R"CO$_2$)$_4$X$_2$     (I)

in which X is a halogen anion, R is an alkyl group, and each of R, R' and R" is one of the alkyl groups shown below:

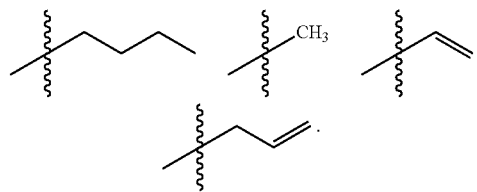

In some embodiments, the formula (I) is (RSn)$_6$O$_4$(R'CO$_2$)$_4$(R"CO$_2$)$_4$Cl$_2$. In some embodiments, the photo-active compound is formed by: adding RSnCl$_3$ and a first silver carboxylate salt in an organic solvent to form a mixture and stirring the mixture under reflux and purifying the mixture by recrystallization. In some embodiments, the organic solvent is dichloromethane (DCM). In some embodiments, the first silver carboxylate salt is selected from the following compounds:

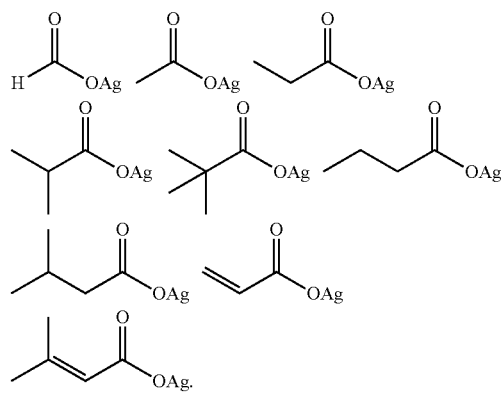

In some embodiments, the photo-active compound is formed by: adding RSnCl$_3$, a first silver carboxylate salt and a second silver carboxylate salt different from the first silver carboxylate salt in an organic solvent to form a mixture and stirring the mixture under reflux and purifying the mixture by recrystallization. In some embodiments, the first silver carboxylate salt has a size greater than a size of the second silver carboxylate salt. In some embodiments, the first silver carboxylate salt and the second silver carboxylate salt are selected from the following compounds:

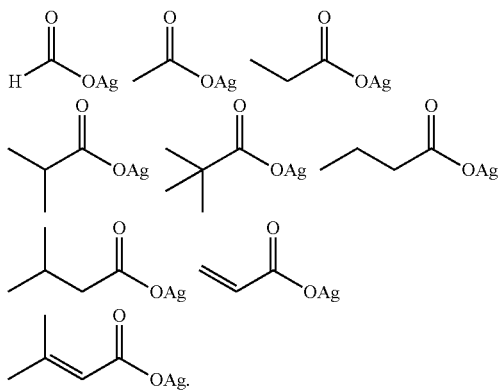

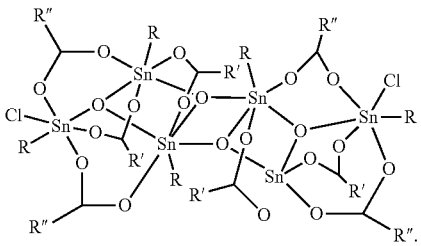

In some embodiments, a photoresist includes a solvent and a photo-active compound dissolved in the solvent and containing the following formula (I):

$$(RSn)_6O_4(R'CO_2)_4(R''CO_2)_4X_2 \qquad (I),$$

in which X is a halogen anion, R is an alkyl group, and each of R, R' and R" is one of the alkyl groups shown below:

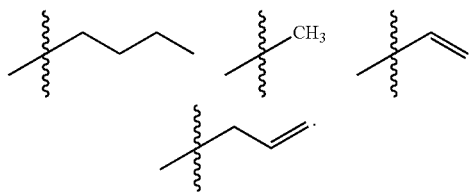

In some embodiments, the formula (I) is $(RSn)_6O_4(R'CO_2)_4(R''CO_2)_4Cl_2$. In some embodiments, the formula (I) is $(n\text{-}BuSn)_6O_4(CH_3CO_2)_8Cl_2$. In some embodiments, the photo-active compound has at least one ladder type structure. In some embodiments, the photo-active compound has 6-tin ladder-type clusters.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a photoresist layer over a substrate;
    selectively exposing the photoresist layer to an EUV radiation; and
    developing the selectively exposed photoresist layer,
    wherein prior to developing the selectively exposed photoresist layer, the photoresist layer has a composition comprising:
       a solvent; and
       a photo-active compound dissolved in the solvent and composed of a molecular cluster compound incorporating hexameric tin and two chloro ligands, the molecular cluster compound has a structure 2. The method of claim 1, wherein the molecular cluster compound is $(RSn)_6O_4(R'CO_2)_4(R''CO_2)_4Cl_2$.

3. The method of claim 2, wherein the R' has a size smaller than a size of the R".

4. The method of claim 2, wherein the R' and the R" has the same structural formula.

5. The method of claim 1, wherein the molecular cluster compound is $(n\text{-}BuSn)_6O_4(CH_3CO_2)_8Cl_2$.

6. The method of claim 1, wherein the EUV radiation has a dose in a range from 100 mJ/cm$^2$ to 200 mJ/cm$^2$.

7. The method of claim 1, wherein a content of the photo-active compound is 1.2 wt % to 1.5 wt % in the solvent with respect to the photoresist layer.

8. The method of claim 1, wherein developing the selectively exposed photoresist layer is performed using acetone.

9. An extreme ultraviolet lithography (EUVL) method, comprising:
    turning on a droplet generator to eject a metal droplet toward a zone of excitation in front of a collector;
    turning on a laser source to emit a laser toward the zone of excitation, such that the metal droplet is heated by the laser to generate EUV radiation;
    guiding the EUV radiation, by using one or more first optics, toward a reflective mask in an exposure device; and
    guiding the EUV radiation, by using one or more second optics, reflected from the reflective mask toward a photoresist coated substrate in the exposure device,
    wherein prior to guiding the EUV radiation, by using the one or more first optics, toward the reflective mask in the exposure device, the photoresist comprises:
       a solvent; and
       a photo-active compound dissolved in the solvent and containing the following formula (I):

$$(RSn)_6O_4(R'CO_2)_4(R''CO_2)_4X_2 \qquad (I),$$

wherein X is a halogen anion,
R is an alkyl group, and
each of R, R' and R" is one of the alkyl groups shown below:

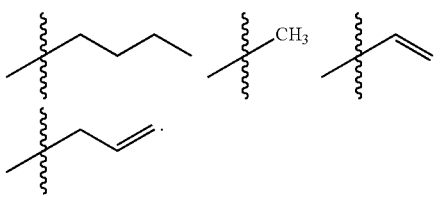

the formula (I) has a structure:

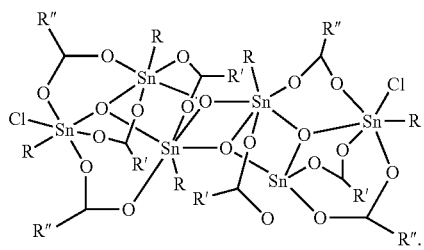

10. The method of claim 9, wherein the formula (I) is $(RSn)_6O_4(R'CO_2)_4(R''CO_2)_4Cl_2$.

11. The method of claim 10, wherein the photo-active compound is formed by:
adding $RSnCl_3$ and a first silver carboxylate salt in an organic solvent to form a mixture; and
stirring the mixture under reflux and purifying the mixture by recrystallization.

12. The method of claim 11, wherein the organic solvent is dichloromethane (DCM).

13. The method of claim 11, wherein the first silver carboxylate salt is selected from the following compounds:

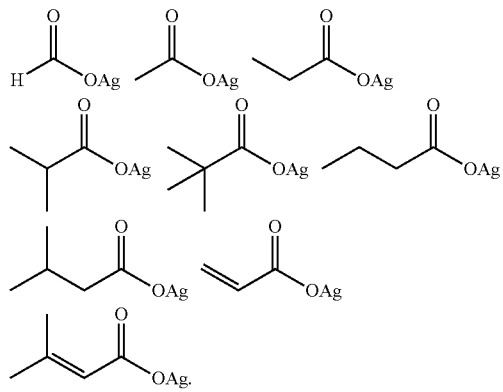

14. The method of claim 9, wherein the photo-active compound is formed by:
adding $RSnCl_3$, a first silver carboxylate salt and a second silver carboxylate salt different from the first silver carboxylate salt in an organic solvent to form a mixture; and
stirring the mixture under reflux and purifying the mixture by recrystallization.

15. The method of claim 14, wherein the first silver carboxylate salt has a size greater than a size of the second silver carboxylate salt.

16. The method of claim 14, wherein the first silver carboxylate salt and the second silver carboxylate salt are selected from the following compounds:

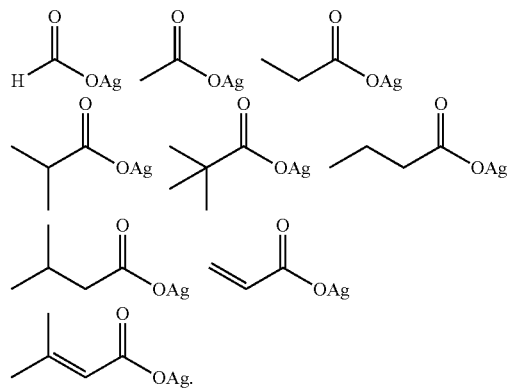

17. The method of claim 9, wherein in the structure of the formula (I), each of the Sn is bonded to a single one of the R.

18. A photoresist, comprising:
a solvent; and
a photo-active compound dissolved in the solvent and containing the following formula (I):

$$(RSn)_6O_4(R'CO_2)_4(R''CO_2)_4X_2 \qquad (I),$$

wherein X is a halogen anion,
R is an alkyl group, and
each of R, R' and R" is one of the alkyl groups shown below:

the formula (I) prior to exposing the photoresist to an extreme ultraviolet (EUV) radiation has a structure:

19. The photoresist of claim 18, wherein the formula (I) is $(RSn)_6O_4(R'CO_2)_4(R''CO_2)_4Cl_2$.

20. The photoresist of claim 18, wherein in the structure of the formula (I), R' and R" are the same.

* * * * *